United States Patent
Margomenos et al.

(10) Patent No.: US 10,079,160 B1
(45) Date of Patent: Sep. 18, 2018

(54) SURFACE MOUNT PACKAGE FOR SEMICONDUCTOR DEVICES WITH EMBEDDED HEAT SPREADERS

(71) Applicant: HRL LABORATORIES LLC, Malibu, CA (US)

(72) Inventors: Alexandros D. Margomenos, Pasadena, CA (US); Miroslav Micovic, Thousand Oaks, CA (US); Eric M. Prophet, Santa Barbara, CA (US)

(73) Assignee: HRL Laboratories, LLC, Malibu, CA (US)

( * ) Notice: Subject to any disclaimer, the term of this patent is extended or adjusted under 35 U.S.C. 154(b) by 858 days.

(21) Appl. No.: 14/286,923

(22) Filed: May 23, 2014

Related U.S. Application Data

(60) Provisional application No. 61/837,766, filed on Jun. 21, 2013.

(51) Int. Cl.
*H01L 21/48* (2006.01)
*H01L 21/56* (2006.01)
(Continued)

(52) U.S. Cl.
CPC ........ *H01L 21/4871* (2013.01); *H01L 21/486* (2013.01); *H01L 21/561* (2013.01);
(Continued)

(58) Field of Classification Search
CPC . H01L 21/4871; H01L 21/486; H01L 21/561; H01L 23/367; H01L 23/49811;
(Continued)

(56) References Cited

U.S. PATENT DOCUMENTS 3,681,513 A    8/1972   Hargis
4,159,221 A *  6/1979   Schuessler .............. H01L 21/52
                                                    156/285

(Continued)

OTHER PUBLICATIONS

Woo et al, Effects of Various Metal Seed Layers on the Surface Morphology and Structural Composition of the Electroplated Copper Layer, Apr. 2009, Metals and Materials International, vol. 15, No. 2, pp. 293-297.*

(Continued)

*Primary Examiner* — Yu Chen
*Assistant Examiner* — Scott Bauman
(74) *Attorney, Agent, or Firm* — Ladas & Parry

(57) ABSTRACT

A method of mounting one or more semiconductor or microelectronic chips, which includes providing a carrier; temporarily adhering the one or more semiconductor or microelectronic chips to the carrier with active faces of the one or more chips facing towards the carrier; providing a package body with at least one chip-receiving opening therein and with at least one contact opening therein; temporarily adhering the package body to the carrier with the at least one opening in the package body accommodating at least a portion of the one or more chips; covering backsides of the one or more chips and filling empty spaces between the one or more chips and walls of the at least one opening in the package body with a metallic material; filling the at least one contact opening with the aforementioned metallic material; wirebonding contacts on the active faces of the one or more chips with contact surfaces in electrical communication with the metallic material in the at least one contact opening; and releasing package body with the one or more chips embedded in the metallic material from the carrier.

31 Claims, 8 Drawing Sheets

(51) Int. Cl.
*H01L 23/00* (2006.01)
*H01L 23/367* (2006.01)
*H01L 23/498* (2006.01)
*H01L 29/20* (2006.01)

(52) U.S. Cl.
CPC ...... *H01L 23/367* (2013.01); *H01L 23/49811* (2013.01); *H01L 23/49827* (2013.01); *H01L 23/49838* (2013.01); *H01L 24/48* (2013.01); *H01L 29/2003* (2013.01); *H01L 2221/68313* (2013.01); *H01L 2221/68345* (2013.01); *H01L 2224/48225* (2013.01)

(58) Field of Classification Search
CPC ......... H01L 23/49827; H01L 23/49838; H01L 24/48; H01L 29/2003; H01L 2221/68313; H01L 2221/68345; H01L 2224/48225; H01L 2225/06541; H01L 23/315; H01L 2224/03001; H01L 2224/11001; H01L 2224/43001; H01L 2224/43; H01L 2224/85005; H01L 2224/01; H01L 24/01
USPC .................................................. 438/107, 122
See application file for complete search history.

(56) References Cited

U.S. PATENT DOCUMENTS

| | | | |
|---|---|---|---|
| 5,073,521 A | 12/1991 | Braden | |
| 5,198,385 A | 3/1993 | Devitt | |
| 5,262,351 A * | 11/1993 | Bureau | H01L 21/6835 257/723 |
| 5,276,455 A | 1/1994 | Fitzsimmons et al. | |
| 5,371,404 A | 12/1994 | Juskey | |
| 5,583,377 A * | 12/1996 | Higgins, III | H01L 23/13 257/706 |
| 5,953,594 A * | 9/1999 | Bhatt | H01L 21/481 257/703 |
| 6,018,459 A | 1/2000 | Carlson | |
| 6,028,367 A | 2/2000 | Yu | |
| 6,249,439 B1 | 6/2001 | DeMore et al. | |
| 6,900,765 B2 | 5/2005 | Navarro et al. | |
| 6,989,592 B2 | 1/2006 | Chang et al. | |
| 7,015,060 B1 | 3/2006 | Kubena | |
| 7,067,397 B1 | 6/2006 | Chang-Chien | |
| 7,271,479 B2 | 9/2007 | Zhao | |
| 7,292,381 B1 | 11/2007 | Patterson | |
| 7,364,063 B2 | 4/2008 | Schaenzer | |
| 7,683,469 B2 | 3/2010 | Oh | |
| 7,733,265 B2 | 6/2010 | Margomenos et al. | |
| 7,777,315 B2 | 8/2010 | Noquil | |
| 7,808,013 B2 | 10/2010 | Mendendorp | |
| 8,013,434 B2 * | 9/2011 | Lin | H01L 21/486 257/698 |
| 8,093,690 B2 | 1/2012 | Ko | |
| 8,178,963 B2 * | 5/2012 | Yang | H01L 21/6835 257/678 |
| 8,178,964 B2 * | 5/2012 | Yang | H01L 23/5389 257/698 |
| 8,334,592 B2 | 12/2012 | Bhagwagar et al. | |
| 8,375,576 B2 | 2/2013 | Kwon | |
| 8,617,927 B1 * | 12/2013 | Margomenos | H01L 23/3677 257/678 |
| 8,644,020 B2 | 2/2014 | Lau | |
| 8,754,522 B2 | 6/2014 | Meyer et al. | |
| 8,759,147 B2 | 6/2014 | Choi | |
| 9,040,420 B2 * | 5/2015 | Sugiyama | H01L 21/67132 438/149 |
| 9,059,140 B1 | 6/2015 | Margomenos | |
| 9,337,124 B1 | 5/2016 | Herrault | |
| 9,385,083 B1 | 7/2016 | Herrault | |
| 9,508,652 B1 | 11/2016 | Herrault | |
| 2003/0006499 A1 | 1/2003 | Choi | |
| 2004/0126931 A1 | 7/2004 | Hembree | |
| 2005/0077596 A1 | 4/2005 | Bauer | |
| 2005/0077614 A1 | 4/2005 | Chengalva et al. | |
| 2005/0155752 A1 | 7/2005 | Larson | |
| 2006/0027635 A1 | 2/2006 | Schaenzer et al. | |
| 2006/0091509 A1 | 5/2006 | Zhao | |
| 2006/0157223 A1 | 7/2006 | Gelorme | |
| 2006/0292747 A1 | 12/2006 | Loh | |
| 2007/0015666 A1 | 1/2007 | Thieme | |
| 2007/0075420 A1 | 4/2007 | Lu et al. | |
| 2007/0247851 A1 | 10/2007 | Villard | |
| 2007/0290326 A1 | 12/2007 | Yang | |
| 2008/0099770 A1 | 5/2008 | Mendendorp | |
| 2008/0128897 A1 | 6/2008 | Chao | |
| 2008/0179725 A1 | 7/2008 | Chia | |
| 2008/0298021 A1 | 12/2008 | Ali et al. | |
| 2009/0108437 A1 | 4/2009 | Raymond | |
| 2009/0134421 A1 | 5/2009 | Negley | |
| 2009/0294941 A1 | 12/2009 | Oh et al. | |
| 2009/0309209 A1 | 12/2009 | Chen | |
| 2010/0140799 A1 | 6/2010 | Do | |
| 2010/0283144 A1 | 11/2010 | Liang | |
| 2010/0285637 A1 | 11/2010 | Khan | |
| 2010/0320588 A1 | 12/2010 | Dahilig | |
| 2010/0327465 A1 | 12/2010 | Shen et al. | |
| 2011/0049558 A1 | 3/2011 | Lin | |
| 2011/0059578 A1 | 3/2011 | Lin | |
| 2011/0291249 A1 * | 12/2011 | Chi | H01L 21/4832 257/675 |
| 2012/0129298 A1 * | 5/2012 | Lin | H01L 25/16 438/118 |
| 2012/0139095 A1 | 6/2012 | Manusharow | |
| 2012/0217627 A1 | 8/2012 | Tseng et al. | |
| 2012/0241942 A1 | 9/2012 | Ihara | |
| 2012/0276403 A1 * | 11/2012 | Nakagawa | H01L 23/373 428/610 |
| 2013/0093085 A1 * | 4/2013 | Seah | H01L 23/4334 257/738 |
| 2014/0084445 A1 | 3/2014 | Lin | |
| 2014/0332974 A1 * | 11/2014 | Schuckman | H01L 23/49827 257/774 |
| 2015/0007965 A1 | 1/2015 | Joshi | |

OTHER PUBLICATIONS

From U.S. Appl. No. 14/080,691 (unpublished; non-publication request filed), Office Action dated Dec. 17, 2014.
U.S. Appl. No. 14/703,545, filed May 4, 2015, Margomenos.
From U.S. Appl. No. 14/080,691 (unpublished; non-publication request filed), Office Action dated Apr. 16, 2015.
From U.S. Appl. No. 14/054,572 (unpublished, non publication request filed), Office Action dated Feb. 12, 2015.
From U.S. Appl. No. 14/703,545 (filed May 4, 2015; unpublished; non-publication request filed), Application and Office Actions.
From U.S. Appl. No. 14/080,691 (unpublished; non-publication request filed), Notice of Allowance dated Aug. 12, 2015.
U.S. Appl. No. 14/702,619, filed May 22, 2015, Herrault.
From U.S. Appl. No. 14/720,619 (unpublished; non-publication request filed), Office Action dated Sep. 28, 2015.
Herrault, et al., "Silicon-packaged GaN power HEMTs with integrated heat spreaders," Electronic Components and Technology Conference (ECTC), 2015 IEEE 65th, Conference: May 26 to May 29, 2015.
From U.S. Appl. No. 14/054,572 (unpublished; non-publication request filed), Office Action dated Sep. 19, 2014.
From U.S. Appl. No. 14/720,619 (Unpublished, Non-Publication Requested), Notice of Allowance dated Feb. 24, 2016.
U.S. Appl. No. 14/703,545 (unpublished; non-publication request filed), Office Action dated May 24, 2016.
U.S. Appl. No. 13/306,827, filed Nov. 29, 2011, Margomenos.
U.S. Appl. No. 14/054,572, filed Oct. 15, 2013, Margomenos.
U.S. Appl. No. 14/080,691, filed Nov. 14, 2013, Margomenos.
From U.S. Appl. No. 13/306,827 (now U.S. Pat. No. 8,617,927), Office Application dated Aug. 15, 2013.
From U.S. Appl. No. 13/306,827 (now U.S. Pat. No. 8,617,927), Office Application dated Mar. 7, 2013.

(56) References Cited

OTHER PUBLICATIONS

From U.S. Appl. No. 13/306,827 (now U.S. Pat. No. 8,617,927), Office Application dated Jan. 19, 2013.

From U.S. Appl. No. 14/054,572 (unpublished, non publication request filed), Office Action dated Jul. 10, 2014.

From U.S. Appl. No. 14/080,691 (unpublished, non publication request filed), Application and Office Actions.

Chen, K.C., et al., "Thermal Management and Novel Package Design of High Power Light Emitting Diodes", National Kung University, Taiwan, Electronic Components and Technology Conference, 2008.

Feeler, R., et al., "Next-Generation Microchannel Coolers", Northrop Grumman, Proceedings of SPIE 2008.

Margomenos, A. et al. for "Wafer-Level Packaging Method Incorporating Embedded Thermal Management for GaN-Based RF Front-Ends," IEEE Intersociety Conference on Thermal and Thermomechanical Phenomena in Electronic Systems (ITHERM), May 27-30, 2014 in Orlando, Florida.

From U.S. Appl. No. 14/703,545 (Unpublished, Non-Publication Requested), Non-Final Rejection dated Dec. 15, 2015.

Chang-Chien, P. et al., "MMIC Packaging and Heterogeneous Integration Using Wafer-Scale Assembly," CS Mantech Conference, pp. 143-146, (May 14-17, 2007).

Margomenos A. et al., "Novel Packaging, Cooling and Interconnection Method for GaN High Performance Power Amplifiers and GaN Based RF Front-Ends," Proceedings of the 7th European Microwave Integrated Circuits Conference, pp. 615-618, (Oct. 29-30, 2012).

Margomenos, A. et al., "X-Band Highly Efficient GaN Power Amplifier Utilizing Built-In Electroformed Heat Sinks for Advanced Thermal Management," IEEE International Microwave Symposium, 2013 (4 pages).

Brown, D.F. et al., "High-speed, enhancement-mode GaN power switch with regrown n+ GaN ohmic contacts and staircase field plates," IEEE Electron Device Letters, vol. 34, No. 9, pp. 1118-1120, Sep. 2013.

Ejeckam, F. et al., "Diamond for enhanced GaN device performance," in Proc. IEEE Intersociety Conference on Thermal and Thermomechanical Phenomena in Electronic Systems (ITherm), Orlando, FL, May 27-30, 2014, pp. 1206-1209.

Faqir, M. et al., "Improved thermal management for GaN power electronics: Silver diamond composite packages," Microelectronics Reliability, vol. 52, Issue 12, pp. 3022-3025, 2012.

Nochetto, H.C. et al., "GaN HEMT junction temperature dependence on diamond substrate anisotropy and thermal boundary resistance," in Proc. IEEE Compound Semiconductor Integrated Circuit Symposium (CSICS), La Jolla, CA, Oct. 14-17, 2012, pp. 1-4.

Shinohara, K. et al., "Scaling of GaN HEMTs and Schottky diodes for submillimeter-wave MMIC applications," IEEE Trans. Electron Devices, vol. 60, No. 10, pp. 2982-2996, 2013.

* cited by examiner

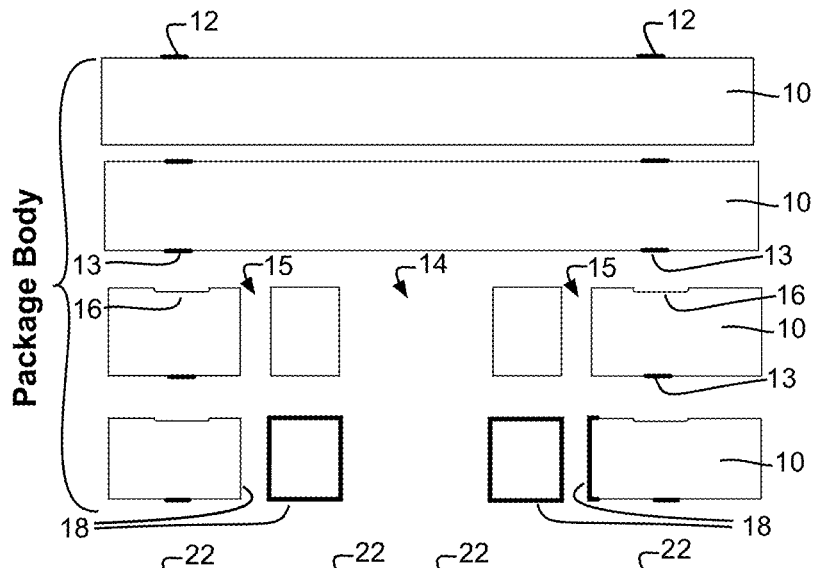
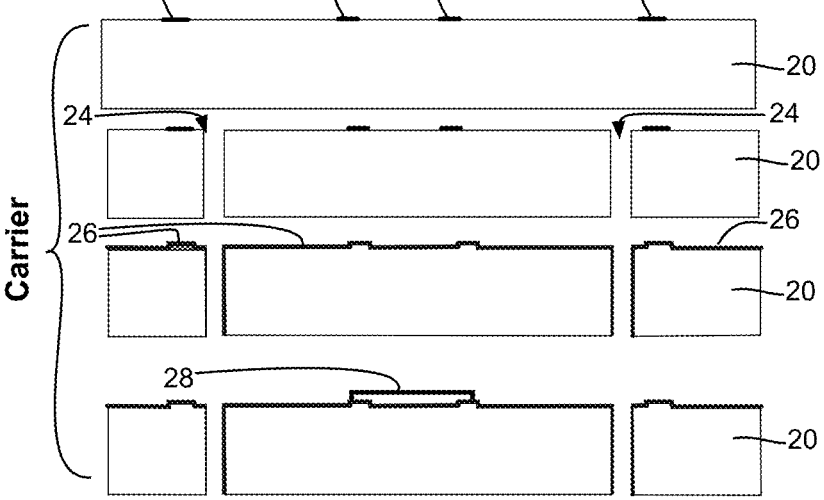
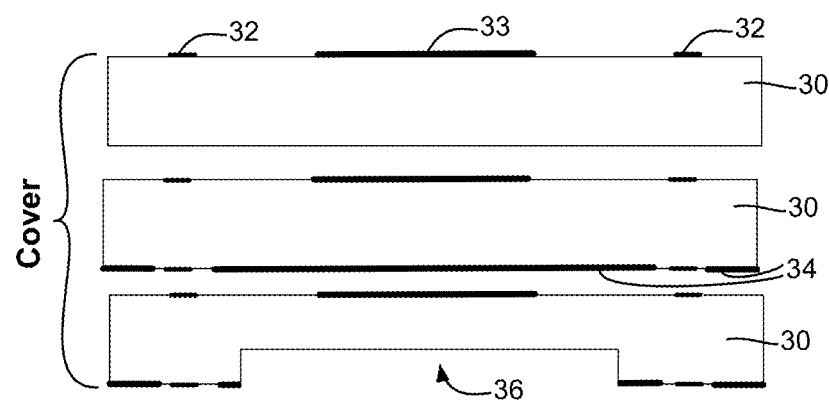

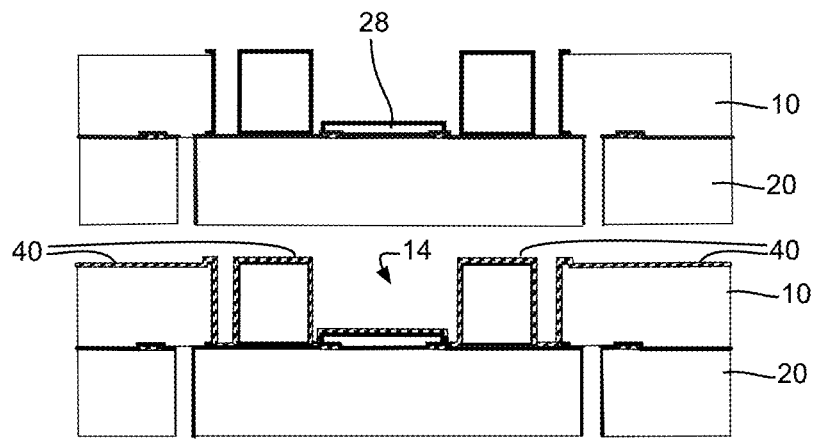
FIG. 1l
FIG. 1m
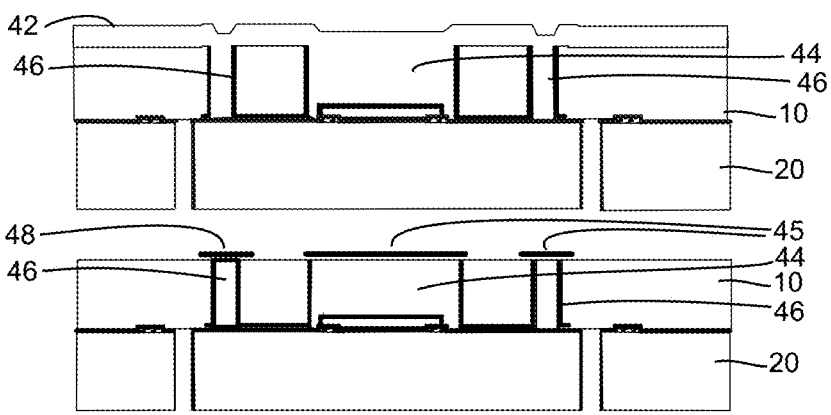
FIG. 1n
FIG. 1o
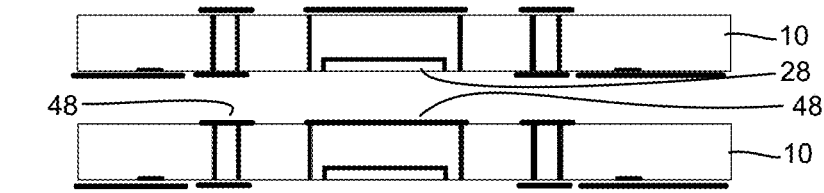
FIG. 1p
FIG. 1q
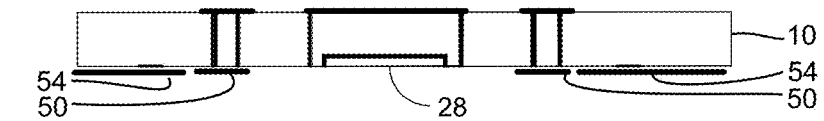
FIG. 1r
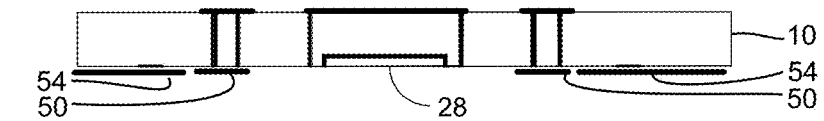
FIG. 1s
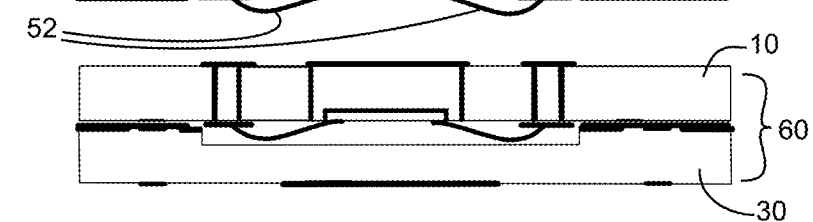
FIG. 1t

SURFACE MOUNT PACKAGE FOR SEMICONDUCTOR DEVICES WITH EMBEDDED HEAT SPREADERS

CROSS REFERENCE TO RELATED APPLICATIONS

This application is related to U.S. patent application Ser. No. 13/306,827 filed Nov. 29, 2011 and entitled "Interconnection, packaging and cooling of microelectronic chips", now U.S. Pat. No. 8,617,927, the disclosure of which is hereby incorporated herein by reference.

This application also claims the benefit of U.S. Provisional Patent Application No. 61/837,766 filed Jun. 21, 2013, the disclosure of which is hereby incorporated herein by reference.

STATEMENT REGARDING FEDERALLY SPONSORED RESEARCH OR DEVELOPMENT

This invention was made under US Government contract no. DAPRA MPC, FA8650-11-C-7181 and therefore the US Government may have certain rights in and to this invention.

TECHNICAL FIELD

This invention pertains to a low thermal resistance and low interconnect parasitic surface mount packaging approach for semiconductor and other high power devices. The semiconductor devices may comprise GaN chips, for example.

BACKGROUND

Heat is a critical bottleneck to the performance and reliability of microelectronic circuits and systems. Wide-bandgap GaN and SiC devices operate at much higher power density than traditional Si and GaAs devices and thus they tend to generate more heat. Therefore, existing thermal management solutions designed for Si and GaAs devices are usually not adequate for GaN and SiC chips. GaN devices can generate heat fluxes in excess of 1 $kW/cm^2$ and thus novel, highly efficient micro-cooling systems are necessary in order to enable the use of such devices in actual in-use environments.

As just mentioned heat extraction is a major bottleneck for microelectronic chips and as such it has generated a lot of R&D efforts from multiple companies. Advances in silicon micromachining, micro-molding, material science (compound heat sinks with matched CTE, thermoplastic TIM etc) and material growth (CVD grown carbon nano-tubes and thin film diamond) over the last decade have significantly increased the efficiency and heat extraction ability of micro-cooling systems. However, none of these technologies are adequate for wide band gap semiconductors (GaN and SiC) which generate heat fluxes in excess of 1 $kW/cm^2$ and none simultaneously addresses packaging, interconnection and cooling.

The known prior art includes the following:

1. K-C Chen et al, Thermal management and novel package design of high power light emitting diodes, National Cheng Kung University, Taiwan, Electronic Components and Technology Conference, 2008. These authors present a method for cooling high power light emitting diodes (LED) by doing electroless plating of Cu on the backside of the diode (FIG. 1 of their paper shows a cross section of their propose package). They assert that this design reduces junction temperature by up to 40° C. and thermal resistance by as much as 40%. The authors use conventional wirebonds which are applicable to singulated LED chips with fixed chip sizes and thicknesses but cannot be reasonably used for high frequency components due to their parasitic inductance and thus are not compatible when trying to combine multiple chips of various sizes and substrate thicknesses in close proximity to each other.

2. A. A. Ali et al, "Notebook computer with hybrid diamond heat spreader," Apple Inc., US Patent Application: US 2008/0298021 A1, filed May 31, 2007. The inventors are disclosing the use of CVD deposited thin film diamond for a heat spreader. The chip is mounted on thin film diamond using a TIM material (solder, thermal grease, phase change epoxy, or thin film metal: Ti/Pt/Au layer). The heat spreader is a thin film diamond, a diamond/copper hybrid, a diamond/aluminum hybrid, an aluminum or copper film. The inventors also show different embodiments of their structure where heat pipes are embedded in the heat sink for increase heat transfer coefficient.

3. R. Feeler et al, Next-generation microchannel coolers, Northrop Grumman, Proceedings of SPIE 2008. The authors present a micro-channel cooler for LED arrays using Low Temperature Co-Fired Ceramic (LTCC) material. They propose a heat sink made out of AN, BeO or CVD diamond under the LED chip and then connect this to the LTCC micro-channel. The CTE of LTCC is close to GaAs and InP so the authors are using hard solder (AuSn) to mount the LED on the cooler.

4. J. Oh et al, "Package-on-package system with heat spreader", US Published Patent Application: US 2009/0294941, filing date: May 30, 2008. The inventors present a package-on-package system that includes mounting the chip on a base substrate, positioning an interposer over the chip and forming a heat spreader around the chip and the interposer. Their approach focuses on multi-stacked chips and extracting heat from inside the stack by inserting the heat spreader between the packages as well as at the top of the module.

5. M. J. Schaenzer et al, Thermally coupling an integrated heat spreader to a heat sink, US Patent Application: US 2006/0027635, filing date: Aug. 9, 2004. The inventors present a mounting method where the base of the heat sink is selectively plated with solder and connected to a heat spreader plated with Au. The heat sink is connected to the top of the chip.

6. CREE Inc. CREE has patent applications related to cooling of semiconductor chips which are identified here by their publication numbers: US 2009/0134421 by G. H. Negley, "Solid metal block semiconductor light emitting device mounting substrates and packages"; US 2008/0099770 by N. W. Mendendorp, "Integrated heat spreaders for light emitting devices and related assemblies"; US 2007/0247851 by R. G. Villard, "Light emitting diode lighting package with improved heat sink"; and US 2006/0292747 by B. P. Loh, "Tops surface mount power light emitter with integral heat sink".

All these are more traditional cooling approaches and rely on mounting the LED chips on various heat sinks. Our disclosed concept of directly forming the heat sink on the backside of the chips is superior since it offers optimum heat rejection, minimum weight and size, ability to integrate with chips of different size and thickness, and ability to interconnect the chips (especially as this relates to high frequency applications).

7. B. D. Raymond, "Wafer scale integrated thermal heat spreader", M/A-COM Inc, US Patent Application: US 2009/

0108437, filing date: Oct. 29, 2007. This invention of Raymond discloses a method of creating a heat sink by backside metallization of a wafer. This metallization is realized with composite electroplating of various metallic compounds with variable CTE. Some examples are Cu-Diamond, Cr-Diamond, or metallic compounds with Be, BeO and carbon nano-tubes. After the wafer is backside metalized, the individual chips are diced.

8. S. Z. Zhao et al, "Flip chip package including a non-planar heat spreader and method of making the same", Broadcom Inc, US Patent Application: US 2006/0091509, filing Date Nov. 3, 2004. Zhao et al. discloses a traditional cooling approach focusing on flip-chip interconnected packages. The main concept is the formation of a cavity on the heat sink which allows for easier integration of the chip.

9. Intel: (a) US 2008/0128897 by T. W. Chao, "Heat spreader for a multi-chip package", which is similar to prior art above, this is a more conventional approach focusing on flip-chip mounted chips. The arguments from the above paragraph are applicable in this case as well; and (b) US 2007/0075420 by D. Lu et al, "Microelectronic package having direct contact heat spreader and method of manufacturing same." This approach is similar to the D. B. Raymond technique mentioned above.

In summary, the available solutions today are included in the following list. It is believed that none of these approaches can adequately handle the +1 kW/cm$^2$ heat flux with the exception of the forced water-cooled microchannels developed by IBM. However, that approach relies on an expensive external pump to move the water at high flow rates close to the chip. The estimated cost of this approach makes impractical for mass production. Furthermore, none of these solutions adequately addresses the issue of interconnecting these devices which is particularly critical in high frequency applications.

By reviewing the prior art, the disclosed invention offers significant improvements that are not obvious to an a person in this field. For example, this invention addresses the very important issue of interconnecting the packaged devices. Due to the disclosed sequence of the fabrication steps, the present approach offers an excellent solution for simultaneously cooling, packaging and interconnecting microelectronic chips (known-good-die) of various sizes, substrate thicknesses and substrate types (Si, SiGe, SiC, GaAs, GaN, InP, quartz, sapphire or any other suitable microelectronic substrate). Prior art only addresses the cooling problem and does not offer any solutions for overall packaging and interconnecting of the devices.

Interconnection becomes particularly important for high frequency systems where long wirebonds are prohibitive due to their parasitic inductances. However, by using the disclosed 3D interconnection approach with through substrate vias we can achieve excellent interconnection between chips and satisfy a long-felt need of offering a complete system-in-package solution that combines multi-functionality and excellent high frequency performance, encapsulation/packaging and cooling.

This invention is compatible with 3D multi-chip integration which is a recent trend in microelectronics for both commercial and defense applications due to the reduction is size, weight, form factor and power consumption. There are four main motivations for 3D integration:

(1) Form Factor: reduce size and form factor of system

I (2) Increased Electrical Performance: shorten interconnect length, reduce parasitics, reduce power consumption (3) Heterogeneous Integration: integrate different functional layers (RF, memory, logic, MEMS, imagers, exotic substrates etc) based on different optimized process nodes (4) Cost: at some point 3D integration will be cheaper than further shrinking 2D design rules.

The invention allows the realization of 3D integrated systems that include an embedded micro-cooling.

The disclosed invention is compatible with low cost manufacturing large panel tape & reel processes and offers the potential of large commercial success in multiple industries (automotive, aerospace & defense, PC, commercial electronics etc).

By eliminating the need for special materials for mounting the chips on the boards (solder and TIM) this invention eliminates two major high thermal resistance bottlenecks which create significant reliability problems in microelectronics. Furthermore, this invention is enabling the introduction of wide band gap devices (GaN, SiC) into systems since these chips operate at higher power densities and generate more heat compared to conventional Si and GaAs devices.

BRIEF DESCRIPTION OF THE INVENTION

In one aspect the present invention provides a method of packaging one or more semiconductor devices with one or more embedded heat spreaders, the method comprising: forming a carrier substrate, forming a plurality of release holes in said carrier substrate and coating at least a portion of the substrate with a temporary adhesive. At least one chip is temporarily adhered to said carrier substrate using the temporary adhesive. A package body substrate is formed having at least one opening therein for receiving said at least one chip and having a plurality of contact vias therein. Then a surface of the package body substrate is temporarily adhered to said carrier substrate with said at least one chip received in said at least one opening therein. A material with a suitable heat transfer characteristic is electroplated on the package body substrate filling those portions of the at least one opening not occupied by said at least one chip received in said at least one opening with said material and also filling the plurality of contact vias, the material filling those portions of the at least one opening not occupied by said at least one chip being in heat-transfer contact with at least five sides of said at least one chip and forming the aforementioned embedded heat spreaders. Excess portions of the electroplated material are preferably removed and the temporary adhesive is sufficiently dissolved to allow the package body substrate to be separated from the carrier substrate.

In another aspect the present invention provides a method of mounting one or more semiconductor or microelectronic chips, comprising: providing a carrier; temporarily adhering said one or more semiconductor or microelectronic chips to said carrier with selected or active faces of said one or more chips facing towards said carrier; providing a package body with at least one chip-receiving opening therein and with at least one contact opening therein; temporarily adhering said package body to said carrier with said at least one opening in said package body accommodating at least a portion of said one or more chips; covering backsides of said one or more chips and filling empty spaces between said one or more chips and walls of said at least one opening in said package body with a metallic material; filling said at least one contact opening with said metallic material; wirebonding contacts on the selected or active faces of said one or more chips with contact surfaces in electrical communication with the metallic material in said at least one contact opening; and releasing package body with said one or more chips embedded in said metallic material from said carrier.

In yet another aspect the present invention provides a method of mounting one or more semiconductor or microelectronic chips, comprising: providing a carrier; temporarily adhering a package body to said carrier using an adhesive; forming at least one chip-receiving opening in said package body, said at least one chip-receiving openings completely penetrating said package body; forming plurality of contact openings in said package body, said plurality contact openings each completely penetrating said package body; aligning said at least one chip-receiving opening in said package body with said one or more semiconductor or microelectronic chips in said one or more openings, with one or more ones of said semiconductor or microelectronic chips in each of said one ore more chip-receiving openings and with selected or active faces of said chips facing towards said carrier; filling empty spaces around said one or more chips in said openings and between said one or more chips and walls of said one or more openings with a metallic material; filling said plurality contact openings with a contact material to thereby form a plurality of contacts; releasing the assembly from said carrier; and forming interconnections between the selected or active faces of the one or more chips with said plurality of contacts.

In still yet another aspect the present invention provides a method of mounting one or more semiconductor or microelectronic chips comprising: providing a carrier; temporarily adhering said one or more semiconductor or microelectronic chips to said carrier with frontsides of said one or more chips facing towards said carrier; providing a package body with at least one chip-receiving opening therein and with at least one contact opening therein; temporarily adhering said package body to said carrier with said at least one opening in said package body accommodating at least a portion of said one or more chips; covering backsides of said one or more chips and filling empty spaces between said one or more chips and walls of said at least one opening in said package body with heat sinking material; filling said at least one contact opening with electrically conductive material; connecting contacts on the frontsides of said one or more chips with contact surfaces in electrical communication with the electrically conductive material in said at least one contact opening; and releasing package body with said one or more chips embedded in said heat sinking material from said carrier.

BRIEF DESCRIPTION OF THE DRAWINGS

FIGS. 1a-1t show a preferred fabrication process to realize the disclosed package.

FIGS. 3(a) and 3(b) show the "package body" wafer while

DETAILED DESCRIPTION

Figure 2:
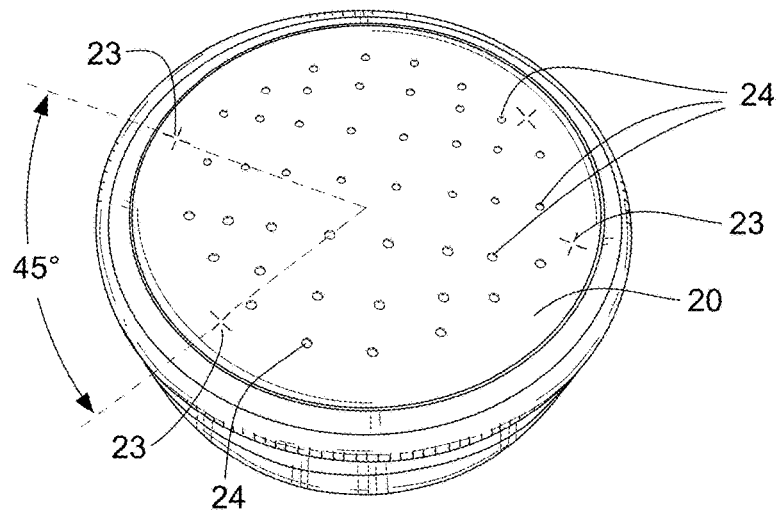
FIG. 2 depicts a photograph of the "carrier" wafer with the alignment marks and etched release holes.

This invention pertains to the creation of a low thermal resistance and low interconnect parasitic surface mount packaging approach for GaN and other high power devices. FIGS. 1a-1t show a preferred fabrication process to realize the package. First the "package body" is formed according to FIGS. 1a-1d. A suitable substrate (alumina, AlN, silicon etc) 10 is patterned and printed with alignment marks 12, 13 preferably on both its front (note alignment marks 12 on FIG. 1a) and back-side (note alignment marks 13 on FIG. 1b) to support micro-fabrication techniques. Then opening 14 and vias 15 (see FIG. 1c) are cut through the substrate 10 preferably using a laser cutting system, mechanical drilling, or a dry etch process (ICP, DRIE etc). These openings or holes and vias 14 and 15 through substrate 10, which will accommodate the heat spreader (in opening 14) and provide for electrical connections (vias 15), are preferably formed at the same time. A shallow valley 16 is preferably formed where the front alignment marks 12 had been as an alignment marker 16. A seed layer 18 is then preferably sputtered on both sides of the wafer 10 (see FIG. 1d) using an appropriate mask (not shown). This seed layer 18 will be used to electroplate the heat spreader and vias in subsequent steps.

Preferably the substrate 20 of the "carrier" (formed according to FIGS. 1e-1h) is of the same material as is selected for substrate 10 of the "package body". This helps ensure that no differential coefficient of thermal expansion issues will occur when temporarily bonding the two substrates 10, 20 together. The carrier substrate 20 is preferably first patterned and printed alignment marks 22 on the front-side (see FIG. 1e) and then release holes 24 (see FIG. 1f) are etched therein preferably utilizing the same etch process (laser or dry etching) as used with reference to FIG. 1c. The carrier substrate 20 is next preferably coated with a temporary adhesive 26 (see FIG. 1g) which is preferably applied by spin coating it. Some of the temporary adhesive 26 may end up in release holes 24 which is be removed during a subsequent immersion of the carrier in a solvent. The temporary adhesive 26 is preferably a standard transparent photoresist (so that the alignment marks 22 can still be seen) and is utilized to mount the chip or chips 28 temporarily that need to be packaged (see FIG. 1h). Preferably, the chip(s) 28 to be mounted are known to be good before mounting them on substrate 20. When initially reducing this invention to practice, we used an FC-300 die bonder made by Smart Equipment Technology for aligning and mounting the chip 28 on the two inner most alignment marks 22 (see FIG. 1h). The alignment marks 22 are preferably only about 150 nanometers thick while the temporary adhesive 26 is preferably eight to ten microns thick. The chip dimples the adhesive 26 but preferably does not touch the alignment marks 22 due to these thickness differences. Other fabrication equipment and adhesives can alternatively be used if desired.

Figure 5:
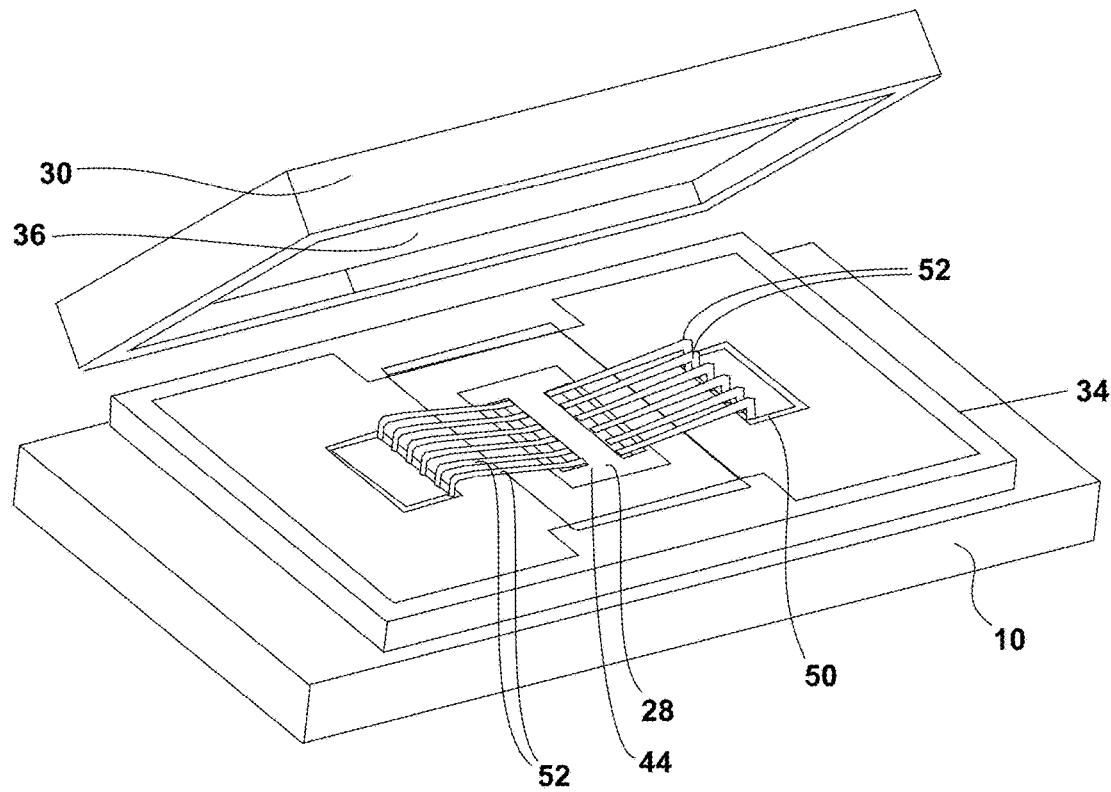
FIG. 5 shows a 3D rendering of the diced final packaged chip with its electroformed heat sink, the wirebonds connecting the chip to the through substrate vias and the cover with the package cavity.

For the substrate 30 of the "cover" (formed according to FIGS. 1i-1k), we preferably use the same material as for substrates 10 and 20. We pattern and print alignment marks 32 and dicing streets 33 (for use later with a dicing saw) on the front side (see FIG. 1i) and on the back we deposit a metallic bonding ring 34 (see FIGS. 1j and 5) preferably formed of Au (an Au—Au bond is used later to affix the cover over the chip(s) mounted in the package body). The bonding ring 34 may assume a rectangular configuration as depicted in FIG. 5 and may also define an outer perimeter of the packaging for the chip(s). Next a bonding cavity 36 (see FIG. 1k) is etched in substrate 30. This etch can be done with either a laser cutting tool or a dry etching process.

The "carrier" substrate 20 with the chip or chips 28 temporarily mounted on it (see FIG. 1h), is then temporarily bonded (see FIG. 1l) to the "package body" substrate 10 using the previously applied temporary adhesive 26 (see FIG. 1g). An additional seed layer 40 is preferably applied by sputtering to cover the bonded wafers 10 and 20 (see FIG. 1m) to facilitate void free contact between the sides of said at least one chip to a subsequently formed heat spreader (or heat sink) 44. Subsequently the heat spreader (or heat sink) 44 is formed in opening 14 (see also FIG. 1c) and the through contacts 46 are formed in substrate vias 15 (see also FIG. 1c) preferably by a layer of electroplated material 42 as depicted by FIG. 1n. The electroplated metal 42 can be Cu, silver, Au or compound metals like Cu-diamond, Cu—W, Cu—Mo or any other combination of metals or other materials that will give appropriate properties for good thermal management. The material of the seed layers 18, 40 is selected as a seed material which is compatible with the material(s) selected for the electroplated metal 42 of the spreader. After plating (FIG. 1n), any excess metal may be removed and the backside of substrate 10 is preferably planarized and polished (see FIG. 1o). This can be done by a variety of methods. A chemical-mechanical polishing technique may be utilized utilizing a chemical slurry and pads with appropriate roughness to remove the electroplated metal without damaging substrate 10. After the metal is planarized and polished, the "package body" substrate 10 is released from the "carrier" substrate 20 (see FIG. 1p) by soaking in an appropriate solvent solution for the adhesive 26. Chip or chips 28 stay with the "package body" substrate 10 as they (or it) are (is) adhered thereto by the layer of electroplated material 42. The release holes 24 previously formed in the substrate 20 facilitate the solvent solution accessing the adhesive 26 and thus more (or fewer) release holes that the number shown in these figures may be used if desired.

After release, conventional photolithographic techniques are used to form backside contact metal 48 (see FIG. 1q) and front-side contact metal 50 (see FIG. 1r) on the metal vias 46. When the front-side contact metal 50 is formed other metalization (see numeral 54) is formed preferably at the same time for the eutectic bond of FIG. 1t. Typical metallization is Ni—Au or any other type of metal that is compatible with subsequent wirebonding or soldering and eutectic bonding. Ni—Au is a preferred material 48, 50 and 54 for as it is a typical finishing metal for Cu used extensively in the printed circuit board industry. After forming the metallization of FIGS. 1p and 1r, bond wires 52 (see FIG. 1s) are used to which take signals from the chip(s) 28 to the front side of the contacts 46 formed in substrate vias 15. All chips (potentially multiple chips 28 can be disposed on the same body wafer) are planarized on their front sides (so that dissimilar substrate thicknesses of different chips 28 are absorbed in the electroplated metal 42) and this allows for the lengths of the wirebonds 52 to be minimized so that parasitic effects of those wirebonds 52 are minimized. The contacts 46 formed in substrate vias 15 then carry the signals from chip(s) 28 to the backside of substrate 10. The wirebonds 52 can be kept very short using this mounting technique thus avoiding longer wirebonds which can introduce larger parasitic inductances incompatible with, for example, chips operating, for example, in the X band (8 to 12 GHz).

The final step is the wafer bonding of the "package body" substrate 10 to the "cover" substrate 30. The cover substrate 30 is not needed for thermal performance but is preferably utilized to seal chip(s) 28 hermetically. For this bond an Au—Au intermetallic bond is preferably used although other types of metal-to-metal bonds may be used (such as In—Au, Ni—Au etch).

Figure 3A:
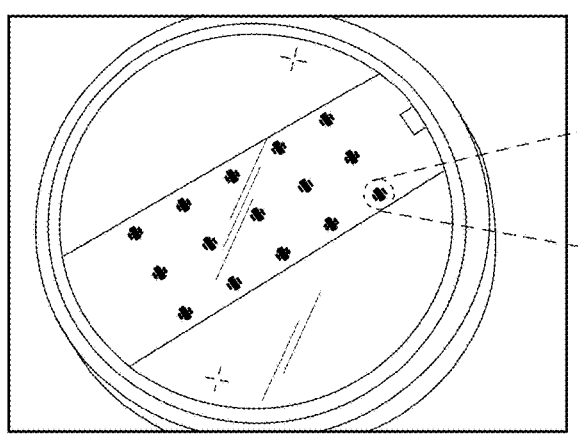
Figure 3B:
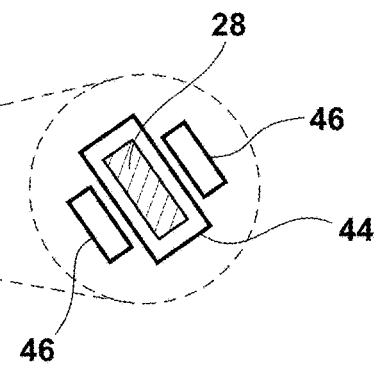
Figure 4:
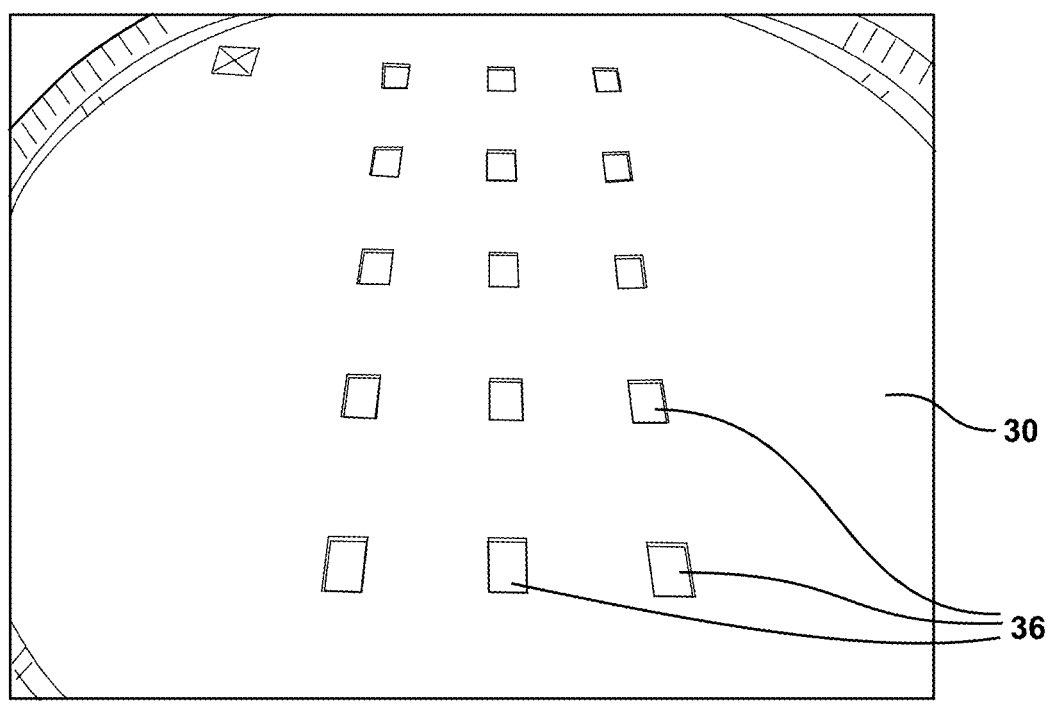
FIG. 4 shows the "cover" wafer and the micromachined cavities.

FIGS. 1a-1t show the fabrication steps in detail for a single surface mount package for semiconductor devices with embedded heat spreaders. Preferably a plurality of semiconductor devices 28 each embedded in a heat spreader or sink 44 are made at the same time. FIG. 2 is a drawing of a bottom view the substrate 20 of the "carrier" wafer (see FIG. 1f, noting the substrate 20 of the "carrier" wafer is preferably of sufficient size to accommodate a plurality of semiconductor devices 28 each embedded in a heat spreader or sink 44. Thus the substrate 20 of the "carrier" has a plurality of etched release holes 24 therein. Optional alignment marks 23 are also depicted which may be used for the ease of manufacture. The etched release holes 24 are used to release the "carrier" wafer from the "package body" wafer. FIGS. 3(a) and 3(b) shows a bottom view the "package body" substrate of FIG. 1q showing a plurality of chips 28 each embedded in heat spreader or sink 44. FIG. 3(b) is an exploded view of a single semiconductor device 28 embedded in a heat spreader or sink 44 with neighboring metal filled vias 46. FIG. 4 shows the "cover" wafer substrate 30 with a plurality of micromachined cavities 36 therein for accommodating a plurality of chips 28.

FIG. 5 shows a 3D rendering of the chip 28 with its electroformed heat sink 44, the wirebonds connecting the chip 24 to the front-side contact metal 50 on top of the through contacts 46 formed in the vias 15 of the "package body" and the "cover" substrate 30 with the package cavity 36 formed therein (shown before the "cover" is mounted on the "package body" as previously described with reference to FIG. 1t).

Figure 6:
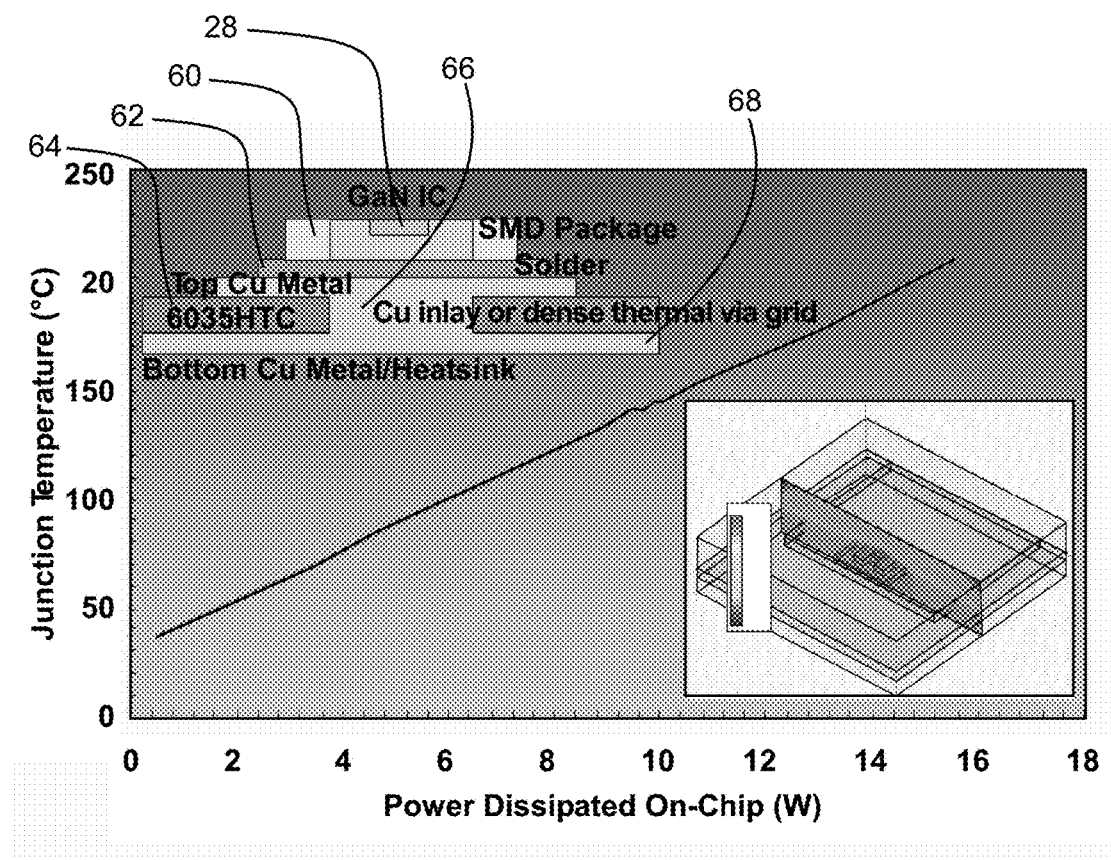
FIG. 6 summarizes the results of the thermal simulation of the disclosed packaging configuration.

FIG. 6 summarizes the results of a thermal simulation of the proposed packaging configuration. The package 60 of FIG. 1t is mounted with 1 mil thick solder 62 on a 20×20 mm$^2$ high thermal conductivity printed circuit board 64 (a Rogers model RT 6035HTC made by Rogers Corporation was assumed for this simulation). The package 60 is soldered on a 15×12.6 mm$^2$ Cu inlay 66 although similar performance is likely achievable with a dense thermal via grid in printed circuit board 64. The simulated structure has a variable thermal load (0.5 to 15 W) on the chip 28 (which is assumed to be a GaN material system chip for this simulation), a natural convection boundary condition from the top IC surface to a 35° C. ambient, an adiabatic boundary condition around the structure and a heat sink 44 with a 200 W/m$^2$K heat transfer coefficient (forced air cooling to a 35° C. ambient). The simulation shows that a maximum junction temperature (Tj) of 150° C. can be maintained with up to 10.6 W of dissipated power in the GaN device 28.

Figure 7:
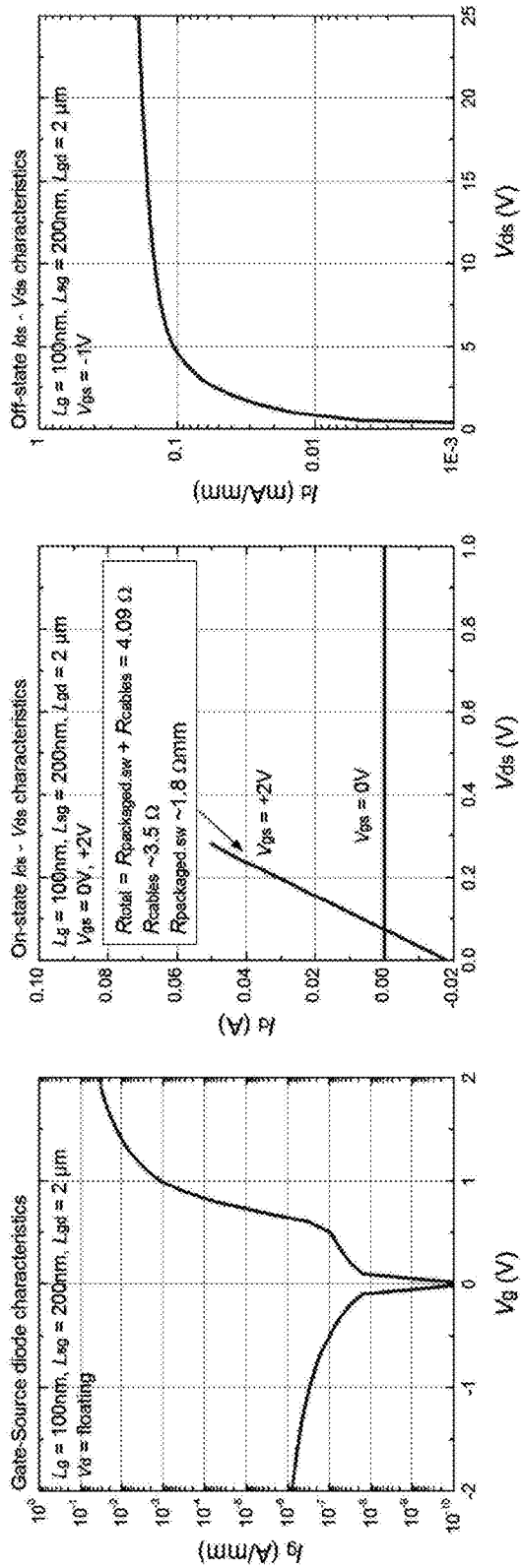
FIG. 7 shows the excellent DC characteristics of a packaged 20×150 µm device (twenty devices in parallel would produce an effective 3 mm effective gate width) (total chip size is 1.48 mm×0.86 mm) in accordance with the present invention.

FIG. 7 shows the excellent DC characteristics of a packaged 20×150 μm (3 mm) device (total chip size is 1.48 mm×0.86 mm). Data shown are the on-state, off-state and gate-source diode data. The characteristics and performance of the packaged device were identical to the unpackaged device.

Figure 8:
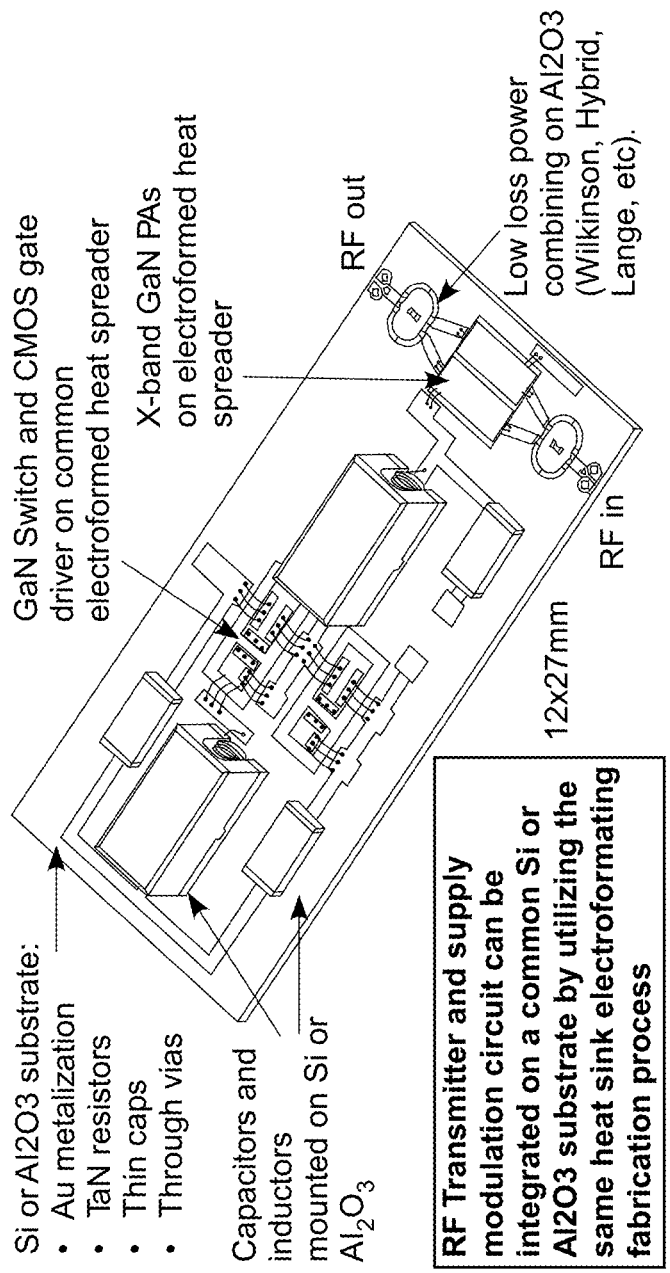
FIG. 8 shows how the presented approach can be extended to include multiple chips on an alumina or silicon wafer.

The presented approach can be extended to include multiple chips on an alumina or silicon wafer 10. In this case, as shown in FIG. 8, the silicon or alumina (Al$_2$O$_3$) substrate can be used as an interposer substrate upon which we can form the Au metallization, TaN resistors, thin capacitors and through-substrate vias. Additional lumped passive elements (capacitors, inductors and resistors) can be mounted on the substrate. Chips that require heat sinking are embedded into their individual heat spreaders (GaN PAs, GaN switch, CMOS gate driver etc) as shown in the Figure. Also, low-loss power combining networks (Wilkinson, Lange, Hybrids etc) can be monolithically integrated on the silicon or alumina substrate. We call the structure shown in FIG. 8, the Integrated Thermal Array Plate (ITAP).

The ITAP can support multiple chips and/or other devices, including optical devices having optical waveguides disposed therein or thereon. By eliminating the need for special materials for mounting the chips on boards (as done in the prior art with solder and thermal greases) this invention eliminates two major high thermal resistance bottlenecks which create significant reliability problems in microelectronics. Furthermore, this invention provides for the introduction of wide band gap devices (GaN, SiC) into systems since these chips operate at higher power densities and generate more heat compared to conventional Si and GaAs devices.

Attached hereto is a paper entitled "Wafer-Level Packaging Method Incorporating Embedded Thermal Management for GaN-Based RF Front-Ends" (unpublished as of the filing date of this application) labeled Attachment A which is incorporated herein by reference and which supplies additional information concerning the disclosed Surface Mount Package for Semiconductor Devices with Embedded Heat Spreaders.

This concludes the description of embodiments of the present invention. The foregoing description of these embodiments and the methods of making same has been presented for the purposes of illustration and description. It is not intended to be exhaustive or to limit the invention to the precise form or methods disclosed. Many modifications and variations are possible in light of the above teachings. It is intended that the scope of the invention be limited not by this detailed description, but rather by the claims appended hereto.

What is claimed is:

1. A method of packaging one or more semiconductor devices with one or more embedded heat spreaders, the method comprising:
   forming a carrier substrate;
   coating at least a portion of the substrate with a temporary adhesive;
   temporarily adhering at least one chip to said carrier substrate using said temporary adhesive;
   forming a package body substrate having at least one opening therein for receiving said at least one chip and having a plurality of contact vias therein;
   temporarily adhering one surface of the package body substrate to said carrier substrate with said at least one chip received in said at least one opening therein, and then electroplating a material with a suitable heat transfer characteristic on or adjacent the package body substrate to thereby at least substantially fill those portions of the at least one opening not occupied by said at least one chip received in said at least one opening with said material and also filling the plurality of contact vias, the material filling those portions of the at least one opening not occupied by said at least one chip being in heat-transfer contact with at least multiple sides of said at least one chip and forming said embedded heat spreaders;
   temporarily adhering one surface of the package body substrate to said carrier substrate with said at least one chip received in said at least one opening therein;
   electroplating a material with a suitable heat transfer characteristic on or adjacent the package body substrate to thereby at least substantially fill those portions of the at least one opening not occupied by said at least one chip received in said at least one opening with said material and also filling the plurality of contact vias, the material filling those portions of the at least one opening not occupied by said at least one chip being in heat-transfer contact with at least multiple sides of said at least one chip and forming said embedded heat spreaders;
   removing excess portions of the electroplated material; and
   dissolving said temporary adhesive sufficiently to allow the package body substrate to release from the carrier substrate.

2. The method of claim 1 including forming a seed material on exposed surfaces of said at least one chip to facilitate void free contact between the multiple sides of said at least one chip to said material with said suitable heat transfer characteristic.

3. The method of claim 2 wherein said at least one chip has a plurality of electrical contacts which are ohmically coupled with the electroplated material in said contact vias.

4. The method of claim 1 further including forming a plurality of release holes in said carrier substrate to assist the step of dissolving said temporary adhesive sufficiently to allow the package body substrate to release from the carrier substrate.

5. The method of claim 4 wherein the carrier substrate and the package body substrate are formed of the same material type which material type is selected from the group consisting of alumina, AlN, and silicon.

6. The method of claim 1 wherein the package body substrate has a top surface and a bottom surface, the top and bottom each being planar and wherein the at least one opening for receiving said at least one chip completely penetrates said package body substrate between its top and bottom surfaces.

7. The method of claim 1 wherein the at least one opening is formed in the package body substrate by laser cutting, mechanical drilling, or a dry etch process.

8. A method of mounting one or more semiconductor or microelectronic chips comprising:
   providing a carrier;
   temporarily adhering said one or more semiconductor or microelectronic chips to said carrier with selected or active faces of said one or more chips facing towards said carrier;
   providing a package body with at least one chip-receiving opening therein and with at least one contact opening therein;
   temporarily adhering said package body to said carrier with said at least one opening in said package body accommodating at least a portion of said one or more chips, and then covering backsides of said one or more chips and filling empty spaces between said one or more chips and walls of said at least one opening in said package body with metallic material;
   filling said at least one contact opening with said metallic material;
   connecting contacts on the selected or active faces of said one or more chips with contact surfaces in electrical communication with the metallic material in said at least one contact opening; and releasing package body with said one or more chips embedded in said metallic material from said carrier.

9. The method of claim 8 wherein the step of temporarily adhering said one or more semiconductor or microelectronic chip to said carrier with selected or active faces of said one or more chips facing towards said carrier is accomplished using a temporary adhesive and wherein the metallic material preferably completely encapsulates the one or more chips from all accessible sides, with the exception of the selected or active faces of the one or more chips.

10. The method of claim 8 wherein the selected or active faces of the one or more chips define a common, planar surface.

11. The method of claim 8 wherein the step of covering backsides of said one or more chips with said metallic material includes a step of covering the backsides of said one or more chips with a seed metallic layer which has a thickness substantially less than a thickness of said metallic material.

12. The method of claim 8 wherein the metallic material is in void-free thermal contact with the backsides of said one or more chips.

13. The method of claim 8 wherein an exposed surface of said metallic material is planarized prior to releasing the package body from said carrier.

14. The method of claim 8 further including providing a cover having a cavity therein and sealing it to said package body for hermetically sealing said one or more chips within said cavity in said cover.

15. The method of claim 8 wherein the step of connecting contacts on the selected or active faces of said one or more chips with contact surfaces in electrical communication with the metallic material is performed by wirebonding.

16. A method of mounting one or more semiconductor or microelectronic chips, comprising:

providing a carrier;

temporarily adhering a package body to said carrier using an adhesive;

forming at least one chip-receiving opening in said package body, the chip-receiving opening being defined by at least one wall in said package body, said at least one chip-receiving opening completely penetrating said package body;

forming plurality of contact openings in said package body, said plurality contact openings each completely penetrating said package body;

aligning said at least one chip-receiving opening in said package body with said one or more semiconductor or microelectronic chips in said at least one opening, with one or more ones of said semiconductor or microelectronic chips in said at least one chip-receiving opening and with a selected surface of said one or more chips facing towards said carrier;

filling empty spaces around said one or more chips in said at least one opening and between said one or more chips and said at least one wall of said one or more openings with metallic material while said package body is on the carrier;

filling said plurality contact openings with contact material to thereby form a plurality of contacts;

releasing the package body, including said plurality of contacts and the metallic material filling said empty spaces, from said carrier; and forming interconnections between the selected surface of the one or more chips with said plurality of contacts.

17. The method of claim 16 wherein the metallic material selected to fill the empty spaces around said one or more chips is also selected to form said plurality of contacts, said plurality of contacts being formed simultaneously with the filling of said empty spaces around said one or more chips.

18. The method of claim 17 wherein said interconnections are formed by wirebonds.

19. The method of claim 16 further including providing a cover having a cavity therein and sealing it to said package body for hermetically sealing said one or more chips within said cavity in said cover.

20. The method of claim 16 wherein said plurality of contacts are capped with contact metal prior to said interconnections being formed.

21. The method of claim 16 wherein the one or more chips in said at least one chip-receiving opening are temporarily adhered to said carrier using a temporary adhesive.

22. The method of claim 16 wherein the metallic material completely encapsulates said one or more chips from all accessible sides, with the exception of the selected surface of said one or more chips.

23. The method of claim 16 wherein the selected surface of the one or more chips define a common, planar surface.

24. The method of claim 16 wherein the one or more chips have a backside surface and wherein the step of filling empty spaces around said one or more chips with said metallic material includes a step of covering the backside surface of said one or more chips with a seed metallic layer which has a thickness substantially less than a thickness of said metallic material.

25. The method of claim 16 wherein the metallic material is in void-free thermal contact with the backsides of said one or more chips.

26. The method of claim 16 wherein an exposed surface of said metallic material is planarized prior to releasing the package body from said carrier.

27. The method of claim 16 wherein the step of filling empty spaces around said one or more chips in said at least one opening and between said one or more chips and said at least one wall of said one or more openings with metallic material is performed after the step of temporarily adhering said package body to said carrier with said at least one opening in said package body accommodating at least a portion of said one or more chips.

28. The method of claim 27 wherein the step of filling empty spaces around said one or more chips in said at least one opening and between said one or more chips and said at least one wall of said one or more openings with metallic material is performed by electroplating said metallic material into said empty spaces thereby filling same with said metallic material.

29. A method of mounting one or more semiconductor or microelectronic chips comprising:

providing a carrier;

temporarily adhering said one or more semiconductor or microelectronic chips to said carrier with frontsides of said one or more chips facing towards said carrier;

providing a package body with at least one chip-receiving opening therein and with at least one contact opening therein;

temporarily adhering said package body to said carrier with said at least one opening in said package body accommodating at least a portion of said one or more chips;

covering backsides of said one or more chips and filling empty spaces between said one or more chips and walls of said at least one opening in said package body with heat sinking material while said package body is on the carrier;

filling said at least one contact opening with electrically conductive material;

connecting contacts on the frontsides of said one or more chips using additional electrically conductive material which is placed in electrical communication with the electrically conductive material in said at least one contact opening; and releasing package body with said one or more chips embedded in said heat sinking material from said carrier.

30. The method of claim 29 wherein the heat sinking material comprises a metallic material and wherein said electrically conductive material comprises said metallic material.

31. The method of claim 29 wherein the heat sinking material includes metallic material and a seed material disposed on selected surfaces of said at least one chip to facilitate a void free heat transfer contact between said at least one chip and the metallic material.

\* \* \* \* \*